United States Patent
Wang et al.

(10) Patent No.: US 11,081,860 B2
(45) Date of Patent: Aug. 3, 2021

(54) INTEGRATED BROADBAND CHAOTIC SEMICONDUCTOR LASER USING OPTICAL MICROCAVITIES

(71) Applicant: TAIYUAN UNIVERSITY OF TECHNOLOGY, Taiyuan (CN)

(72) Inventors: Anbang Wang, Taiyuan (CN); Yixuan Wang, Taiyuan (CN); Yuncai Wang, Taiyuan (CN); Yuanyuan Guo, Taiyuan (CN); Longsheng Wang, Taiyuan (CN); Tong Zhao, Taiyuan (CN)

(73) Assignee: TAIYUAN UNIVERSITY OF TECHNOLOGY, Shanxi (CN)

( * ) Notice: Subject to any disclaimer, the term of this patent is extended or adjusted under 35 U.S.C. 154(b) by 8 days.

(21) Appl. No.: 16/835,803

(22) Filed: Mar. 31, 2020

(65) Prior Publication Data
US 2020/0313386 A1 Oct. 1, 2020

(51) Int. Cl.
*H01S 5/00* (2006.01)
*H01S 5/10* (2021.01)
(Continued)

(52) U.S. Cl.
CPC ............ *H01S 5/1042* (2013.01); *H01S 5/026* (2013.01); *H01S 5/1021* (2013.01);
(Continued)

(58) Field of Classification Search
CPC .......... H01S 5/026; H01S 5/046; H01S 5/142; H01S 5/1042; H01S 5/1021; H01S 5/1025
See application file for complete search history.

(56) References Cited

U.S. PATENT DOCUMENTS 7,242,705 B2 * 7/2007 Kneissl ................. B82Y 20/00
372/50.11
2016/0352066 A1 * 12/2016 Redding ................. G01S 17/00
(Continued)

FOREIGN PATENT DOCUMENTS

CN           104158085 B        4/2017

OTHER PUBLICATIONS

A. Argyris, et al; "Photonic Integrated Device for Chaos Applications in Communications"; Physical Review Letters (PRL-100) dated May 16, 2008; pp. 194101-1 through 194101-4.
(Continued)

*Primary Examiner* — Kinam Park
(74) *Attorney, Agent, or Firm* — Bacon & Thomas, PLLC

(57) ABSTRACT

The present invention discloses an integrated broadband chaotic semiconductor laser using optical microcavities. The arc-shaped hexagonal laser outputs light. Part of the light is totally reflected through the deformed microcavity and then reflected out of the deformed microcavity from the passive waveguide II; after entering the passive feedback waveguide, another part of the light is fed back into the deformed microcavity by the high reflection film, passes through an in-cavity ray track and then is also reflected out of the deformed microcavity from the passive waveguide II; the two-path light is coupled into the arc-shaped hexagonal laser, and finally generated chaotic laser light is directionally coupled and output through the passive waveguide I at the other end of the arc-shaped hexagonal laser. The present invention has wide broadband, flat spectrum, compact structure, and no time delay signature.

2 Claims, 1 Drawing Sheet

(51) Int. Cl.
  *H01S 5/026*   (2006.01)
  *H01S 5/14*    (2006.01)
  *H01S 5/02*    (2006.01)

(52) U.S. Cl.
  CPC ............ *H01S 5/1025* (2013.01); *H01S 5/142* (2013.01); *H01S 5/146* (2013.01); *H01S 5/0207* (2013.01)

(56) References Cited

U.S. PATENT DOCUMENTS

2018/0109325 A1* 4/2018 Ozdemir ................ H01S 3/107
2018/0306696 A1* 10/2018 Ozdemir ............ G01N 21/7746
2020/0067272 A1* 2/2020 Kim ...................... H01S 5/1096
2020/0412092 A1* 12/2020 Zhang ................ H01S 5/34373

OTHER PUBLICATIONS

Qinghai Song et al; "Channeling Chaotic Rays into Waveguides for Efficient Collection of Microcavity Emission"; Physical Review Letter 108, published Jun. 15, 2012; pp. 1-5.

First Office Action issued in Chinese Appln. No. 201910257833.9 dated May 8, 2020.

* cited by examiner

INTEGRATED BROADBAND CHAOTIC SEMICONDUCTOR LASER USING OPTICAL MICROCAVITIES

TECHNICAL FIELD

The present invention relates to the technical field of photonic integrated chaotic semiconductor lasers, and in particular, to an integrated broadband chaotic semiconductor laser using optical microcavities.

BACKGROUND

As a novel and important scientific research tool, chaotic lasers have been widely used. As a special output form of the laser, chaotic laser light features randomness, wide spectrum, etc. Research in recent ten years shows that chaotic laser light has shown important application value in the fields of chaotic synchronization and secure optical communication, high-speed random number key generation, laser radar, fiber network fault detection, ultra-broadband technology, distributed fiber sensing, etc. The semiconductor laser has become the key device for generating chaotic laser light due to its small size, light weight, high conversion efficiency, long service life, easiness in integration, etc.

Methods for generating chaotic laser light by the semiconductor laser include an optical feedback mode, an optical injection mode, a photoelectric feedback mode and a hybrid disturbance mode. In the optical feedback mode, the structure is simple and high-dimensional broadband chaotic oscillation is generated more easily; therefore, the use of an optical feedback semiconductor laser to generate chaotic laser light has become a hot spot for researchers. However, most of the current methods are implemented by using semiconductor lasers and external discrete optical elements (an external cavity length is several meters to tens of meters), which are bulky, complex in structure, vulnerable to external environment and unstable in output. Compared with an apparatus composed of discrete devices, an integrated chip is smaller in size, lower in cost, better in stability and suitable for mass production, and is concerned by research institutes in many countries.

In 2008, the PICASSO project of the EU's 6th Framework Programme developed the first photonic integrated chaotic external cavity feedback semiconductor laser. In 2010, Annovazzi-Lodi et al. of University of Pavia in Italy, Mirasso et al. of the University of the Balearic Islands in Spain and Hamacher of Fraunhofer Institute of Telecommunications of Fraunhofer Heinrich Hertz Institute in Germany developed a dual-feedback photonic integrated chaotic semiconductor laser with an air gap. In 2013, the research group of Xia Guangqiong of Southwest University and the Key Laboratory of Semiconductor Materials Science of Chinese Academy of Sciences jointly developed a monolithic integrated semiconductor laser chip for generating chaotic laser light, etc.

However, the foregoing photonic integrated chaotic semiconductor lasers all adopt a delayed optical feedback structure of a DFB laser, and the generated chaotic laser light has obvious time delay signature, i.e., chaotic signals have certain periodicity. In addition, due to the relaxation oscillation of the laser, energy of the chaotic signals generated by the optical feedback semiconductor laser is mainly concentrated near the relaxation oscillation frequency in the frequency domain, resulting in uneven frequency spectrum, serious low frequency inhibition and narrow bandwidth, which is not conducive to practical application. In summary, there is a great need for a laser that features broadband, flat spectrum, compact structure and no time delay signature.

SUMMARY

At present, most of photonic integrated chaotic semiconductor lasers adopt a delayed optical feedback structure of a DFB laser, and generated chaotic laser light has obvious time delay signature. The DFB laser has relatively low relaxation oscillation frequency, and greater response to the relaxation oscillation frequency than other frequencies, resulting in uneven spectrum and low effective bandwidth of chaotic signals. At present, the length of a monolithic integrated external cavity needs to be at least about 1 cm, which is not conducive to practical application. In order to solve the foregoing problems, an integrated broadband chaotic semiconductor laser using optical microcavities is provided.

The present invention is realized through the following technical solution: an integrated broadband chaotic semiconductor laser using optical microcavities, including an arc-shaped hexagonal laser and a deformed microcavity, where one end of the arc-shaped hexagonal laser is connected with one end of the deformed microcavity through a passive waveguide II, the other end of the deformed microcavity is connected with a passive feedback waveguide, an end face of the passive feedback waveguide is coated with a high reflection film, and the other end of the arc-shaped hexagonal laser is connected with a passive waveguide I.

A method for light output of the integrated broadband chaotic semiconductor laser using optical microcavities specifically includes the following steps of: outputting light by the arc-shaped hexagonal laser, coupling the output light into the deformed microcavity through the passive waveguide II, totally reflecting part of the light through the deformed microcavity and then reflecting the part of the light out of the deformed microcavity from the passive waveguide II; after another part of the light enters the passive feedback waveguide, feeding the light back into the deformed microcavity by the high reflection film, also reflecting the light out of the deformed microcavity from the passive waveguide II after the light passes through an in-cavity ray track, coupling the two-path light into the arc-shaped hexagonal laser, and directionally coupling and outputting finally generated chaotic laser light through the passive waveguide I at the other end of the arc-shaped hexagonal laser.

The integrated chaotic semiconductor laser of the present invention features wide bandwidth, flat spectrum, compact structure, and no time delay signature. The integrated chaotic semiconductor laser internally includes the arc-shaped hexagonal laser and the deformed microcavity. The conventional arc-shaped hexagonal laser features large relaxation oscillation frequency and a flat curve of small signal modulation response, and can eliminate the limitation of the relaxation oscillation frequency on the bandwidth. An arc edge hexagonal single-mode semiconductor laser with the microcavity has a relaxation oscillation frequency of about 11 GHz, and a flat small signal modulation response curve. Under a certain working current, a single-mode output with a modulation bandwidth of 13 GHz is obtained (Optics Letters, 42(7): 1309-1312, 2017). The deformed microcavity is a variant of a circular optical microcavity with certain deformation. A light field inside the ideal circular optical microcavity is in an echo wall mode, while the slightly deformed circular cavity generates complex ray states, and presents periodic orbits with different ray angles [Journal of the Optical Society of America B, 21(5): 923-934, 2004]. Therefore, the deformed microcavity in the present invention has some slight deformation based on the circular cavity, and is not limited to the deformation, thereby presenting periodic orbits with different ray angles. The arc-shaped hexagonal laser and the deformed microcavity are connected and coupled through the passive waveguide II to form an integrated laser, and the other end of the arc-shaped hexagonal laser is connected with the passive waveguide I to output final chaotic laser light. The other end of the deformed microcavity is connected with the passive feedback waveguide. The end face of the passive feedback waveguide is coated with the high reflection film for feeding back light into the deformed microcavity. The arc-shaped hexagonal laser outputs light, the light is coupled into the deformed microcavity through the passive waveguide II, passes through the ray track in the deformed microcavity and then is reflected out of the deformed microcavity from the passive waveguide II, and this is part of feedback light. Another part of the light enters the passive feedback waveguide. Since the end face of the passive feedback waveguide is coated with the high reflection film, the high reflection film feeds back this part of the light into the deformed microcavity, and then after passing through the ray track in the cavity, this part of the light is also reflected out of the deformed microcavity from the passive waveguide II to form an optical feedback. The two parts of the light are integrally coupled into the arc-shaped hexagonal laser, and the finally generated chaotic laser light is directionally coupled and output from the passive waveguide I to obtain the chaotic laser light with wide bandwidth, flat spectrum and no time delay signature.

Compared with the prior art, the integrated broadband chaotic semiconductor laser using optical microcavities according to the present invention can easily generate chaos in an optical feedback mode. A DFB laser has a low relaxation oscillation frequency (several GHz), and greater response to relaxation oscillation frequency than other frequencies, so that the chaotic dynamic is dominated by relaxation oscillation frequency, the spectrum is uneven and the effective bandwidth is low. Taiyuan University of Technology has proposed a method for generating chaotic laser light without time delay signature and with flat spectrum and wide bandwidth by a photonic integrated chaotic semiconductor laser (CN 201410435033.9), which generates chaotic laser light by mutual light injection mainly through left and right distributed feedback semiconductor laser chips. In contrast, in the present invention, the arc edge hexagonal single-mode semiconductor laser with the microcavity is used as a non-linear device and first replaces a DFB semiconductor laser to generate a chaotic light source by using the characteristics of large relaxation oscillation frequency and a flat curve of a small signal modulation response curve, thereby solving the problem that the relaxation oscillation frequency limits the bandwidth. Compared with a mirror delayed optical feedback, an external feedback is constructed by using a two-dimensional optical microcavity, light is totally reflected in the cavity many times, and a large optical path can be obtained with a small geometric size to achieve a long cavity feedback. Compared with that of the patent with light injection (CN 201410435033.9), the long cavity feedback induces a large number of external cavity modes and is more prone to chaos. Deformation is introduced into the microcavity, and randomly distributed feedback paths are formed by complex ray dynamics of the deformed microcavity, namely different total reflection paths of light in the deformed microcavity. This can eliminate the resonance characteristics of the external cavity, the generated chaotic laser light has high complexity, and the bandwidth is 20 GHz or more.

In the figure: 1: passive waveguide I, 2: arc-shaped hexagonal laser, 3: passive waveguide II, 4: deformed microcavity, 5: passive feedback waveguide.

DETAILED DESCRIPTION

Specific examples of the present invention are described below with reference to the accompanying drawings.

Figure 1:
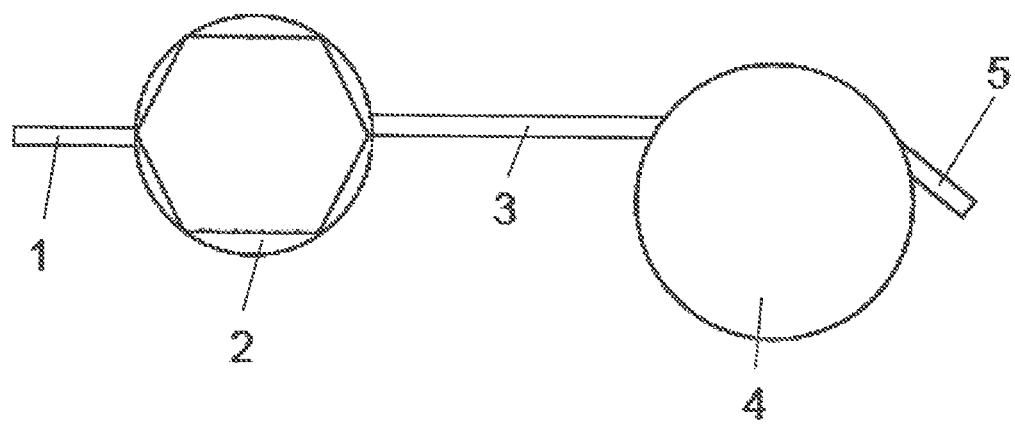
FIG. 1 is a schematic structural diagram of the present invention.

As shown in FIG. 1, an integrated broadband chaotic semiconductor laser using optical microcavities includes, an arc-shaped hexagonal laser 2 and a deformed microcavity 4, where one end of the arc-shaped hexagonal laser 2 is connected with one end of the deformed microcavity 4 through a passive waveguide II 3, the other end of the deformed microcavity 4 is connected with a passive feedback waveguide 5, an end face of the passive feedback waveguide 5 is coated with a high reflection film, and the other end of the arc-shaped hexagonal laser 2 is connected with a passive waveguide I 1.

A method for light output of the integrated broadband chaotic semiconductor laser using optical microcavities specifically includes the following steps of: outputting light by the arc-shaped hexagonal laser 2, coupling the output light into the deformed microcavity 4 through the passive waveguide II 3, totally reflecting part of the light through the deformed microcavity 4 and then reflecting the part of the light out of the deformed microcavity 4 from the passive waveguide II 3; after another part of the light enters the passive feedback waveguide 5, feeding the light back into the deformed microcavity 4 by the high reflection film, also reflecting the light out of the deformed microcavity 4 from the passive waveguide II 3 after the light passes through an in-cavity ray track, coupling the two-path light into the arc-shaped hexagonal laser 2, and directionally coupling and outputting finally generated chaotic laser light through the passive waveguide I 1 at the other end of the arc-shaped hexagonal laser 2.

Figure 2:
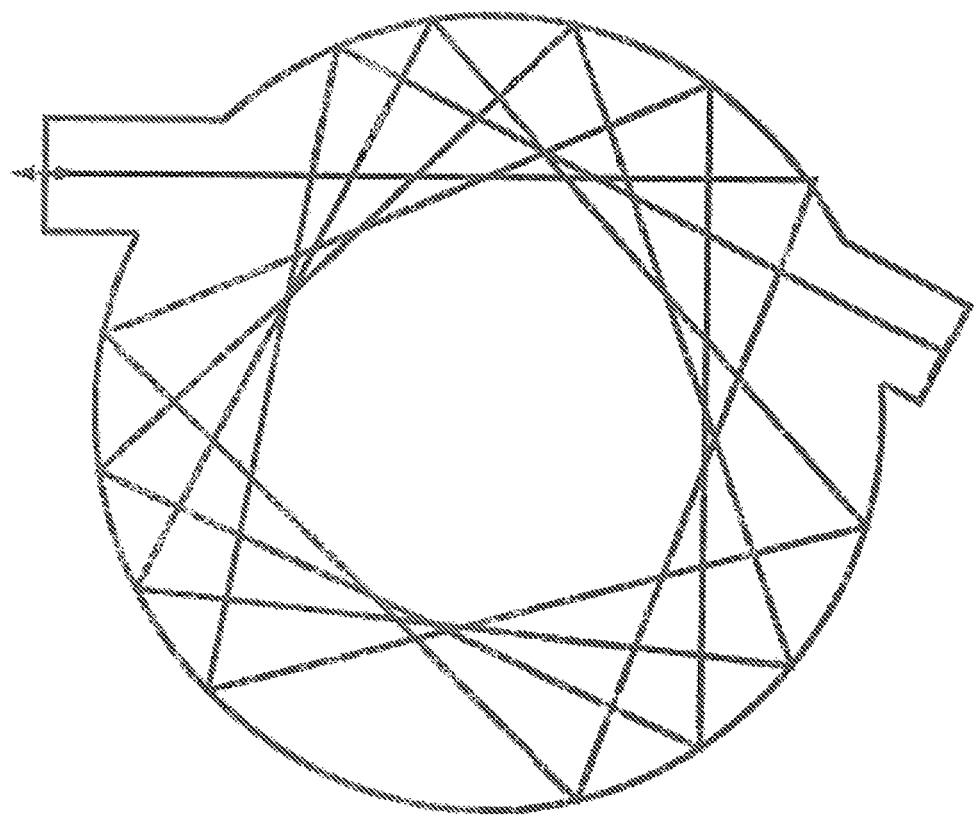
FIG. 2 shows an exemplary diagram of a deformed microcavity and its optical feedback path according to the present invention.

The specific operation of this example is as follows: the arc-shaped hexagonal laser 2 outputs light, the light is coupled into the deformed microcavity 4 through the passive waveguide II 3, part of the light is totally reflected through the deformed microcavity 4 and then reflected out of the deformed microcavity 4 from the passive waveguide II 3, and this is part of feedback light; another part of the light enters the passive feedback waveguide 5; since the end face of the passive feedback waveguide 5 is coated with the high reflection film, the high reflection film feeds this part of the light back into the deformed microcavity 4, and the light passes through the in-cavity ray track and then is also reflected out of the deformed microcavity 4 from the passive waveguide II 3 to form an optical feedback (an in-cavity light ray track is shown in FIG. 2); the two parts of the light are integrally coupled into the arc-shaped hexagonal laser 2, and the finally generated chaotic laser light is directionally coupled and output from the passive waveguide I 1.

The claimed scope of the present invention is not limited to the foregoing specific implementations, and the present invention may have a variety of variations and modifications for those skilled in the art. All modifications, improvements and equivalent replacements made within the conception and principles of the present invention shall be included in the protection scope of the present invention.

What is claimed is:

1. An integrated broadband chaotic semiconductor laser using optical microcavities, comprising an arc-shaped hexagonal laser (2) and a deformed microcavity (4), wherein one end of the arc-shaped hexagonal laser (2) is connected with one end of the deformed microcavity (4) through a passive waveguide II (3), the other end of the deformed microcavity (4) is connected with a passive feedback waveguide (5), an end face of the passive feedback waveguide (5) is coated with a high reflection film, and the other end of the arc-shaped hexagonal laser (2) is connected with a passive waveguide I (1).

2. A method for light output of the integrated broadband chaotic semiconductor laser using optical microcavities according to claim 1, wherein the arc-shaped hexagonal laser (2) outputs light, and the light is coupled into the deformed microcavity (4) through the passive waveguide II (3); part of the light is totally reflected through the deformed microcavity (4) and then reflected out of the deformed microcavity (4) from the passive waveguide II (3); after entering the passive feedback waveguide (5), another part of the light is fed back into the deformed microcavity (4) by the high reflection film, passes through an in-cavity ray track and then is also reflected out of the deformed microcavity (4) from the passive waveguide II (3); the two-path light is coupled into the arc-shaped hexagonal laser (2), and finally generated chaotic laser light is directionally coupled and output through the passive waveguide I (1) at the other end of the arc-shaped hexagonal laser (2).

* * * * *